United States Patent [19]
Becker et al.

[11] Patent Number: 6,089,314
[45] Date of Patent: Jul. 18, 2000

[54] COOLING BODY FOR COOLING POWER GATES

[75] Inventors: Klaus Becker, Bingen; Wolfgang Staiger, Stuttgart; Matthias Jung; Peter Heinemeyer, both of Berlin, all of Germany

[73] Assignees: Daimler-Benz Aktiengesellschaft, Stuttgart; ABB Daimler Transportation (Deutchland) GmbH, Henningsdorf, both of Germany

[21] Appl. No.: 08/945,243
[22] PCT Filed: Feb. 21, 1997
[86] PCT No.: PCT/EP97/00838
  § 371 Date: Oct. 24, 1997
  § 102(e) Date: Oct. 24, 1997
[87] PCT Pub. No.: WO97/31512
  PCT Pub. Date: Aug. 28, 1997

[30] Foreign Application Priority Data

Feb. 24, 1996 [DE] Germany .............................. 19606972

[51] Int. Cl.[7] .................................. F28F 3/12; H05K 7/20
[52] U.S. Cl. .................... 165/168; 165/80.4; 165/170; 257/714; 361/699
[58] Field of Search ............................. 165/170, 177, 165/183, 168, 80.4; 361/699

[56] References Cited

U.S. PATENT DOCUMENTS

| | | | |
|---|---|---|---|
| 1,549,464 | 8/1925 | Dinzl | 165/168 |
| 1,818,387 | 8/1931 | Dinzl | 165/168 |
| 1,884,612 | 10/1932 | Dinzl | 165/168 |
| 1,929,824 | 10/1933 | Polley | 165/168 |
| 2,060,211 | 11/1936 | Hemphill | 165/170 |
| 2,151,540 | 3/1939 | Varga | 165/170 X |
| 5,315,845 | 5/1994 | Lee | 165/170 X |
| 5,323,851 | 6/1994 | Abraham | 165/183 X |
| 5,329,994 | 7/1994 | Collings et al. | |
| 5,638,897 | 6/1997 | Hirano et al. | 165/170 X |
| 5,689,881 | 11/1997 | Kato | 165/177 X |

FOREIGN PATENT DOCUMENTS

| | | | |
|---|---|---|---|
| 8804742 | 7/1985 | Germany . | |
| 3739585 | 5/1989 | Germany . | |
| 3908996 | 9/1990 | Germany . | |
| 4301865 | 7/1994 | Germany . | |
| 4401607 | 7/1995 | Germany . | |
| 4421025 | 12/1995 | Germany . | |
| 174696 | 10/1982 | Japan | 165/183 |
| 17765 | 6/1995 | WIPO . | |

*Primary Examiner*—Leonard Leo
*Attorney, Agent, or Firm*—Venable; Robert Kinberg; Michael P. Leary

[57] ABSTRACT

The invention concerns a cooling body having at least one cooling duct for receiving a cooling medium which is fed to the cooling duct at a predetermined speed, the cooling duct comprising a plurality of stall centers.

26 Claims, 5 Drawing Sheets

2

COOLING BODY FOR COOLING POWER GATES

BACKGROUND OF THE INVENTION

The invention concerns a cooling body for cooling power gates.

The cooling of power gates by means of cooling bodies in the form of so-called cooling rails is known. The cooling agent flows in longitudinal direction through the cooling ducts and thus removes the heat due to energy losses from power gates mounted to the outside of the cooling body. Since the characteristic data for the components depend strongly on the temperature, the aim is not to exceed a maximum temperature gradient of 5 K in longitudinal direction on the cooling surface.

The Patent DE-C-39 08 996 discloses a ceramic cooling body with a plurality of cooling ducts inside the cooling body, wherein the flow through neighboring cooling ducts inside the cooling body is in part parallel and in part antiparallel. The disadvantage of the arrangements is that the heat removal is insufficient. A large temperature gradient forms along the flow direction. The components to be cooled are not on the same temperature level.

WO-A-95/17765 discloses an arrangement where a cooling pipe is pressed into a cooling body in such a way that cross-sectional constrictions develop in the cooling pipe. The disadvantage here is that the flow resistance is increased strongly and the flow does not stall reliably at the constrictions, but can continue to flow laminar. Furthermore, the transition from the cooling body to the pressed-in cooling pipe constitutes an undesired heat resistance, which worsens the cooling.

A cooling rail that is open on both sides is known from DE-A-44 01 607, where a partition with regularly spaced boreholes is placed on the inside of the cooling duct, parallel to the flow direction. The inside of the cooling rail is thereby separated into two cooling ducts. Swirling and flow stall bodies are additionally inserted into each of the two cooling ducts, in order to homogenize and improve the cooling along the duct through the turbulence generated in the cooling agent. However, this measure leads to a drastic increase in the flow resistance in the cooling duct, which cannot be tolerated with the standard high flow speeds in cooling bodies for power gates. The heat resistance between the inserted partition and/or the inserted swirling bodies and the cooling rail furthermore cannot be neglected, so that the partition and the inserts as such hardly contribute to the heat removal.

Cooling bodies for power gates are frequently operated with flow speeds and pressure differences for the cooling agent in the cooling duct that are at the upper performance limit for the cooling body with respect to flow and heat removal.

SUMMARY OF THE INVENTION

It is thus the object of the invention to disclose a cooling body, for which the cooling is improved without resulting in a drastic increase in the flow resistance for the arrangement.

The solution is obtained according to the invention by providing a cooling body having at least one cooling duct for receiving a coolant agent with a predetermined velocity, and an upper and a lower external cooling surface for accepting bodies to be cooled wherein the at least one cooling duct has a nearly constant cross section lengthwise and is provided with at least one flow stall center in the form of boreholes between the cooling ducts that extend lateral to a flow direction, and which in part forms an enlargement of the cooling duct cross section lateral to a flow direction, and wherein the circumferential curve of the total cross section in the region of the enlargement, lateral to the flow direction, has measurements in two dimensions that are larger than the circumferential curve of the cross section outside of the enlargement. Further and advantageous embodiments follow from the description.

The invention starts with the purposeful arrangement of square-edged flow stall centers inside a cooling body, along the cooling duct, in such a way that the flow is stalled reliably. It is preferable if the total cross-section of the cooling duct is enlarged perpendicular to the flow direction at the flow stall centers, and preferably in two dimensions, especially in the width and height of the cooling duct. The flow resistance of the arrangement is not increased noticeably by this.

For one particularly preferred embodiment, the enlargement is formed lateral to the flow direction, circumferential around the cooling duct and thus offers the advantage of increasing the inside surface of the cooling duct. This improves the heat transmission from the cooling body to the cooling agent.

It is advantageous that the enlargements are arranged in the limiting walls of individual cooling ducts and/or partitions between several cooling ducts. These walls are preferably bonded material-to-material with the cooling body on at least one side, and thus offer an extremely favorable heat transmission to the cooling agent.

For one preferred embodiment, the cooling body is essentially formed from one piece. The cooling body is favorably produced with the extrusion method, in particular from aluminum or aluminum alloys, which can be done cost-effectively and simply.

In another preferred embodiment, the cooling body is formed from several, in particular two pieces and in particular top and bottom. It is especially useful to form the cooling ducts and the enlargements in a first section, particularly through milling, and to seal the arrangement tightly with a cover.

For another preferred embodiment, additional and in particular square-edged flow stall centers are arranged in the cooling duct, lateral to the flow direction and essentially perpendicular to the dimensions of the enlargement. It is particularly advantageous if this arrangement has multipart cooling bodies with top and bottom, in which duct walls and enlargements and/or additional flow stall centers, arranged in particular in the region of the enlargements are formed, and which form the total cooling body when assembled. The heat transition from the outside of the cooling body that must be cooled to the cooling agent is increased on the average over the total length of the cooling ducts. The forming of a temperature gradient is decreased considerably through the arrangement according to the invention, and the reliability of the arrangement is increased.

It is particularly advantageous that the heat-transfer coefficient $\alpha$, which decreases in flow direction with an undisturbed flow, in each case increases again strongly behind a flow stall center. It is furthermore advantageous that the temperature level of the cooling arrangement on the whole is lowered.

BRIEF DESCRIPTION OF THE DRAWINGS

The invention is explained in more detail with the aid of embodiments in which.

DETAILED DESCRIPTION OF THE INVENTION

If a cooling agent enters into a cooling duct of a cooling body, in particular with the velocity profile of a piston flow, a boundary layer forms between the limiting walls of the duct through which it flows and the cooling agent moving along the duct, within which the cooling agent has a velocity that decreases rapidly toward the duct wall. This boundary layer brings with it a high heat resistance.

Starting from all limiting walls, the respective boundary layer increases in the flow direction until the boundary layers meet at the duct center and a tube flow is formed. However, the heat-transfer coefficient $\alpha$ simultaneously decreases proportional to 1/d with an increasing boundary layer thickness d. The removal of heat from the duct limiting wall to the cooling agent is clearly made worse in the tube-flow condition.

Figure 1:
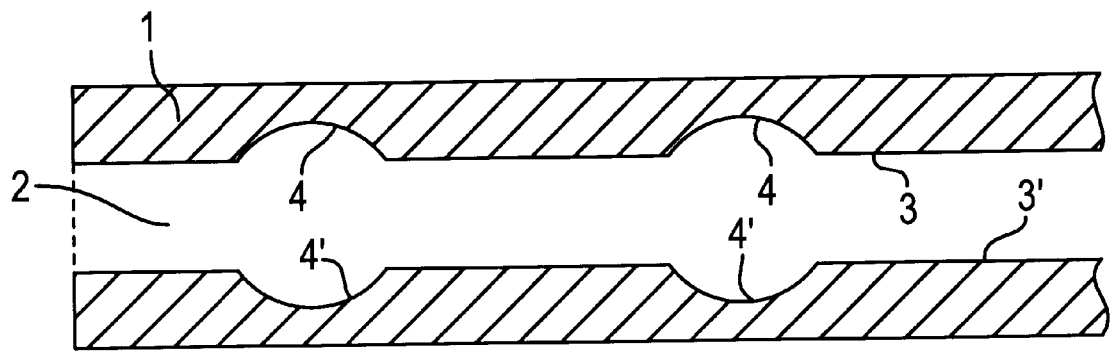
FIG. 1 is a section along a cooling duct with flow stall centers that enlarge the duct.

FIG. 1 shows a longitudinal section through a first embodiment according to the invention of a cooling duct with flow stall centers. The cooling duct height is to be perpendicular to the image plane. The cross section of the cooling duct can be round or angular. In the following example, essentially angular, in particular rectangular cross sections are described, but the invention is not limited to these cross sections.

At least one cooling duct 2 is formed on the inside of a cooling body 1 according to the invention. The flow direction is in the image plane. The cooling duct 2 has local enlargements, wherein the cross section of the cooling duct 2 is enlarged lateral to the flow direction and at specific distances by concave recesses 4, 4' in the duct wall 3, 3'. The enlargements 4, 4' preferably have a square-edged design. The flow stalls reliably at the square edges of the enlargements 4, 4', resulting in an interruption of the formation of a tube flow.

Once the flow stalls, the boundary layer disappears locally and the heat-transfer coefficient $\alpha$ is extremely high directly behind the end of a flow stall center 4, 4'. The boundary layer thickness d increases again in flow direction, and the heat-transfer coefficient $\alpha$ decreases once more during the continued flow path with increasing boundary layer thickness d.

The enlargements 4, 4' are arranged lateral to the flow direction in the duct inside wall 3, 3' and enlarge the total cross section of the cooling duct in two dimensions. For rectangular duct cross sections, this means that in the region of the enlargements, the dimensions of cooling duct 2 are increased in the width as well as in the height. The increase in the width of the cooling duct 2 corresponds to the depth of the enlargement, the increase in the height of the cooling duct corresponds to the height of the enlargement. For other cross sections, in particular round cross sections, the dimensions of the enlargements apply in an equivalent way. It is preferable if the enlargement is open toward the duct.

The enlargements 4, 4' are arranged at the duct inside walls 3, 3' that are located opposite each other, but can also be arranged on one duct wall only or simultaneously on three or all four inside walls, wherein they are preferably arranged facing each other. The enlargements are particularly preferred if they enlarge the cooling duct 2 circumferentially. For one embodiment, the circumferential curve of the total cross section of the cooling duct encloses in the enlargement region the circumferential curve of the cooling duct cross section outside of the enlargement. The two circumferential curves can enclose a joint center or two different centers.

The cooling rail itself can be formed from one piece or be composed of several pieces, in particular of an upper and a lower half. In a first embodiment, at least one cooling duct is milled into each half, and flow stall centers are worked into the partitions. For another embodiment, at least one cooling duct with flow stall centers is incorporated into only one half, wherein the first half is sealed off tightly with the second half.

The enlargements 4, 4' are cooled with less efficiency locally than the duct 2 itself. If the enlargements 4, 4' are positioned opposite each other in pairs on all four duct inside walls, it is advantageous if these are located respectively on the same length of the cooling duct 2. However, the enlargements 4, 4' can also be arranged alternating on the duct walls, located opposite each other either individually and/or in pairs, along the longitudinal extension of the cooling duct.

If water in particular is used as cooling agent, the formation of a boundary layer thickness d causes the heat-transfer coefficient $\alpha$ to drop from far above 6000 for a minimum boundary layer thickness to below 1500 W/(m²K) in the range of, for example, d≈100 μm. It is therefore preferable if the flow stall centers are optimized with respect to dimensions and spacing to each other, such that the boundary layer thickness d for the flow remains low enough at the duct limiting wall 3 to ensure a sufficiently high heat-transfer coefficient $\alpha$.

In accordance with the invention, the distances L between the enlargements 4, 4' are selected at least small enough, so that the heat-transfer coefficient $\alpha$ can drop along the flow direction to at most a fourth of the maximum value, which can be reached for $\alpha$ directly behind the end of the flow stall center. However, it is useful if the distance L is large enough, so that the local heat removal, which is worse in the flow stall center 4, 4' itself, does not essentially increase the cooling body temperature, preferably only by 5 K.

The expansion of the enlargements 4, 4' in flow direction and/or the depth of the enlargements 4, 4' in the duct wall must be planned such that the flow stalls reliably with a standard flow rate for the medium (preferably about 1 m/s for water, oil or the like; preferably 5–10 m/s for gas). The expansion dimension in flow direction should not be too great, since the cooling is also worsened locally at the flow stall centers because of the swirling that occurs, and should not be too small either so as to permit a reliable stalling of the flow. It is useful if the cooling agent velocity is as high as possible, but lower than the velocity that damages the cooling body through abrasion.

It is preferably if the depth of the enlargements lateral to the flow direction is at least twice that of the boundary layer thickness d at this point with undisturbed flow, in particular at least equal to five times the thickness. The boundary layer thickness d depends on various values, in particular the duct dimensions, the flow velocity, the spacing between possible flow stall centers and the cooling agent and can be predetermined, e.g. through simulation calculations.

For a duct cross section of, for example, 5×5 mm$^2$, water as the cooling agent, a flow velocity of approximately 1 m/sec and a distance between the flow stall centers of 15 cm, the depth of the enlargements must be selected to be preferably 0.5–1 mm. The height of the enlargements 4, 4' is preferably at least the same or greater than the local cooling duct height. For round duct cross sections, the height is preferably at least equal to half the diameter of the cooling duct. A radial circumferential enlargement of the cross section for the round cooling duct is advantageous.

Figure 2A:
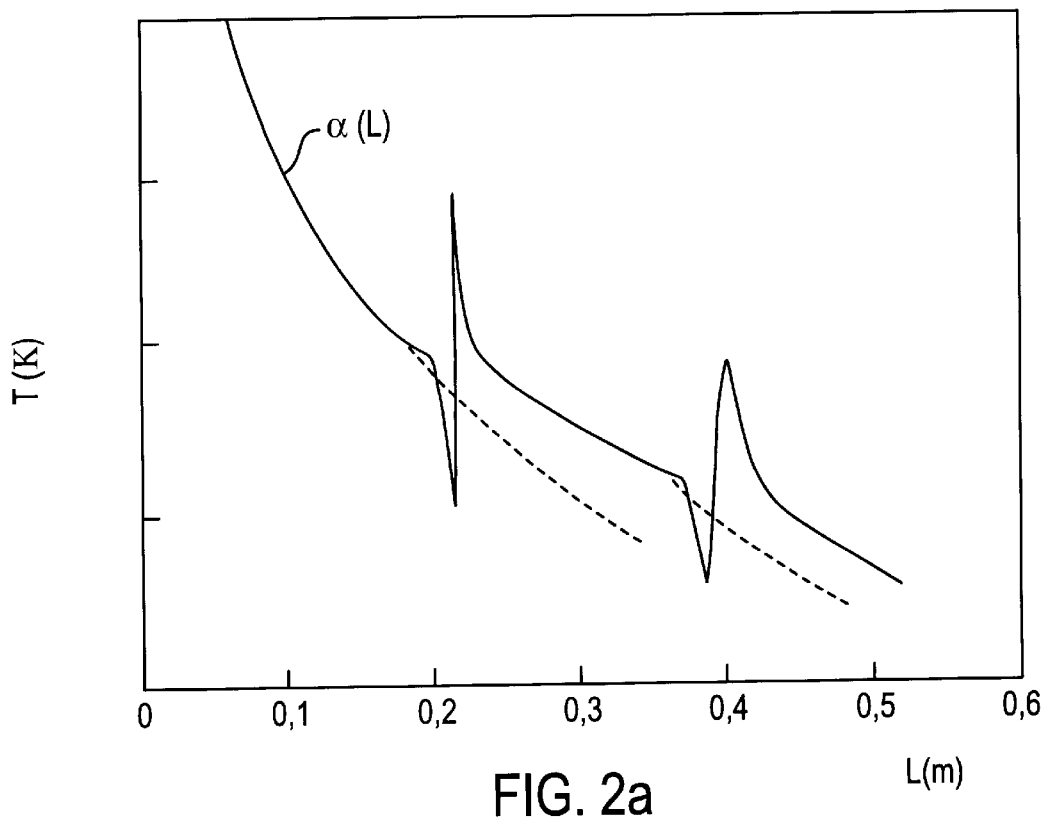
FIG. 2a is the curve for the heat-transfer coefficient along a cooling duct according to the invention.
Figure 2B:
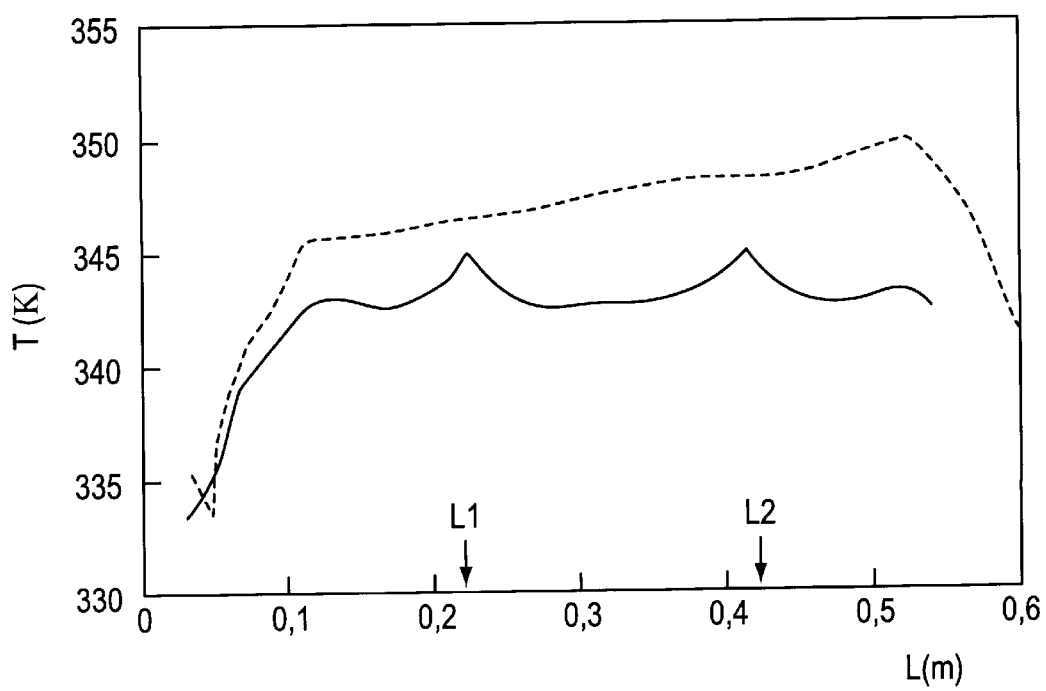
FIG. 2b is the temperature curve along a cooling duct according to the invention.

FIG. 2 provides simulation results for a cooling duct with a length of 0.6 m, inside of which two flow stall centers L1 and L2 are arranged. FIG. 2a is a diagram of the curve for the heat-transfer coefficient α along the cooling duct. The value is clearly higher behind each flow stall center than in front of the flow stall center. FIG. 2b shows the temperature curve along the cooling duct. To be sure, the temperature is locally slightly higher at the flow stall center, but the temperature remains essentially constant outside of the flow stall centers. On the whole, the temperature increase along the duct is small, as compared to the result for a cooling duct without flow stall centers, which is shown with the dashed curve.

The power gates to be cooled are preferably installed in the cooling surface regions of the cooling body, where such temperature plateaus are formed.

The flow stall centers in the form of cross-sectional duct enlargements have the particular advantage that no additional pressure loss occurs along the cooling duct 2 and the swirling of the cooling agent essentially occurs flow-resistance neutral or that it increases the flow resistance only slightly, in particular by a maximum 20%, preferably no more than 10%.

A simple and cost-effective way of producing a one-piece cooling rail, in particular an extruded cooling rail, consists in that the enlargements are produced through boreholes perpendicular to the cooling duct. It is preferable if the borehole diameter is greater than the dimensions of the cooling duct perpendicular to the borehole. As a result of the boring, square-edged flow stall centers in the form of square-edged borders are formed on all cooling duct walls at the same time, which run circumferentially around the duct and extend lateral to the flow direction. A cut along the cooling duct corresponds to the picture shown in FIG. 1, wherein the side walls are parallel to the image plane. The depth of the enlargement corresponds to the depth for the borehole on the side wall of the cooling ducts and the height of the enlargement corresponds to the depth of the concave recess in FIG. 1. If the borehole diameter is smaller or the same size as the cooling duct dimension lateral to the borehole, then flow stall centers are formed only on the two cooling duct walls with boreholes.

However, both embodiments have the additional advantage that the enlargements are respectively arranged in one duct limiting wall and thus are bonded material-to-material on at least one side with the cooling body. The inside surface of the cooling duct is enlarged and the heat transmission into the cooling agent is particularly favorable. The boreholes in the limiting walls can subsequently be sealed off tightly toward the outside by using suitable means.

It is particularly advantageous if several such cooling ducts are arranged parallel to each other in one plane. An upper and a lower limiting surface of the cooling body, parallel to this plane, can function as cooling surfaces, on which the power gates to be cooled are mounted. In particular, the partitions for the ducts can have boreholes in the manner as described above.

With an arrangement as in the DE-A-44 01 607, it would not be possible to install enlargements in the cooling ducts in two dimensions. To be sure, the cooling duct can be enlarged there by growing in the width, but the height of this enlargement on principle can only be less than the height of the duct. The inserted partition would fall apart if the enlargement would have the same dimensions as the duct. An enlargement of the cooling duct that extends circumferentially around the duct cross-section and lateral to the flow direction cannot be realized with the arrangement shown there.

If the cooling agent inside the cooling body according to the invention flows only in one direction, then no flow exchange worth mentioning occurs between the individual, parallel cooling ducts 2, even if the boreholes in the partitions remain unsealed, since approximately the same flow conditions exist in all ducts 2. If the flow through neighboring cooling ducts is also antiparallel, then the boreholes in the partitions between the individual cooling ducts are advantageously sealed off with plugs, as a result of which the flow exchange is almost completely stopped.

A simple means for sealing the boreholes in the partitions is by inserting rods, which are permeable at least in sections and at least in part, in particular are solid at the partition level, but are designed to be permeable at the level of the cooling ducts 2. The rod extends perpendicular to the flow direction and has the added advantage of additionally swirling the flow in the duct center, in the region of the enlargements.

Figure 3:
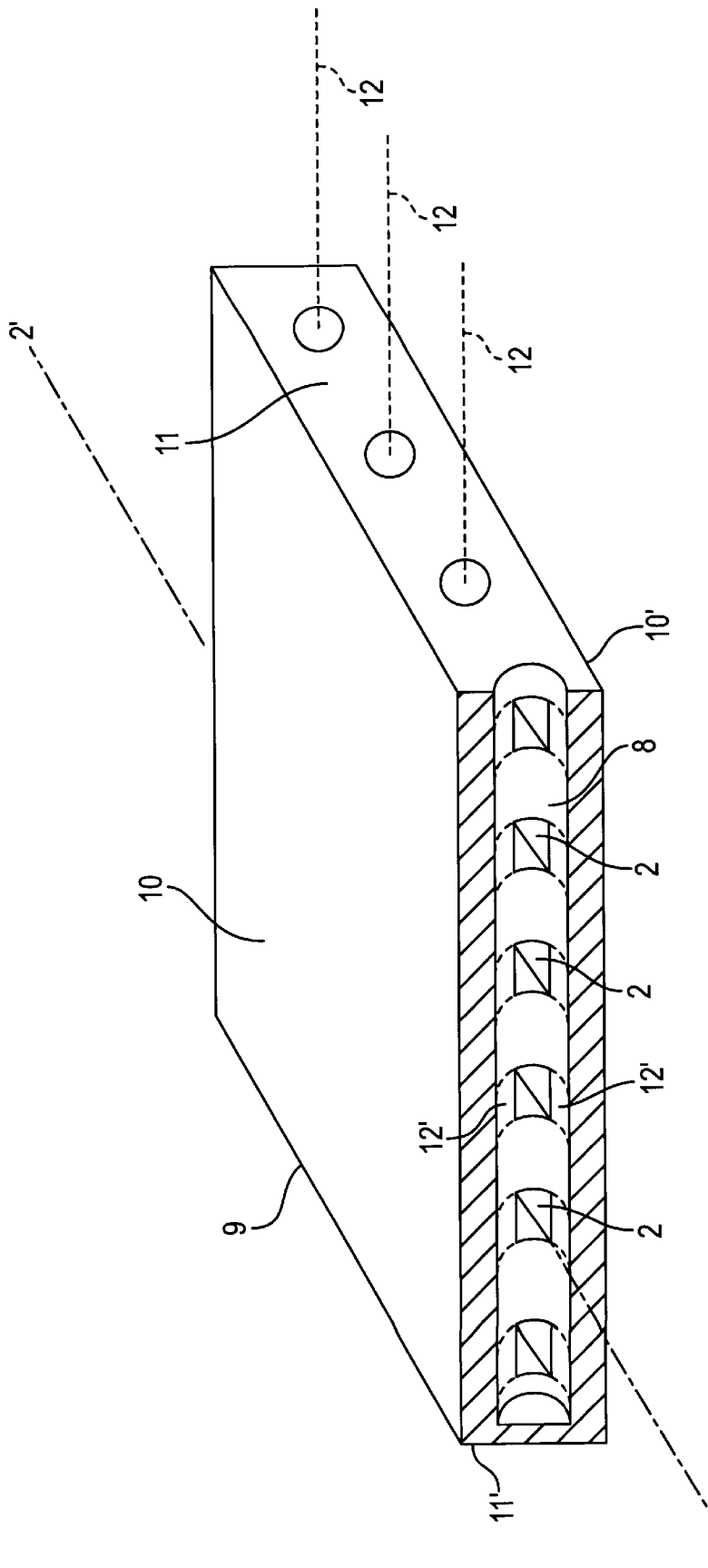
FIG. 3 is a section through a cooling duct with flow stall centers, according to the invention.

FIG. 3 shows a cross section lateral to the flow direction of a cooling body 9 according to the invention, which comprises several parallel cooling ducts 2 arranged in a plane. The flow direction is essentially diagonal to the image plane. A metal, e.g. aluminum, is preferably used for the cooling body. It is particularly preferred if the parallel cooling ducts that extend through a single plane are produced from aluminum through extrusion. The upper and the lower cooling surfaces 10, 10' of the arrangement that extend parallel to the plane for the cooling ducts can accommodate, for example, 4 standard IGBT power gates with respectively 1 kW power dissipation. The cooling ducts 2 are each approximately 50 cm long and have a rectangular cross section of approximately 5×7 mm$^2$. Cooling agent connections and cooling agent reservoirs that may be arranged on the input and/or output side, and/or possible intake aids are not drawn in.

The cooling body 9 has boreholes that are spaced apart by approximately 15 cm in a first outer narrow side 11, perpendicular to the parallel ducts 2, wherein the center axis for the boreholes 12 respectively intersects with the center axis of the duct 2', and the boreholes 12 extend through the partitions 13. The diameter for these boreholes is larger by approximately 2 mm than the duct width of 7 mm, so that circular-arc shaped recesses 12' with a maximum depth of around 1 mm are formed perpendicular to the duct 2' axis respectively on two facing duct walls, on the insides of the cooling surfaces 10, 10'. The circumferential curve of the total cooling duct cross section in the region of the enlargement symmetrically encircles the circumferential curve for the cooling duct cross section outside of the enlargement. The expansion of the enlargement in flow direction corresponds to the chord of the circular arc of the borehole in the wall limiting the cooling duct.

The borehole through the second, outer narrow side 11', which is located opposite the first, narrow side 11, does not extend completely through or is sealed off suitably. The boreholes through the first, narrow side 11 are also sealed. The area 8 is the side wall for a borehole 12.

Measurements show that for a cooling body through which water flows with a flow velocity of approximately 1 m/sec, the temperature curve on an exterior cooling body surface in flow direction shows only slight variations locally, and that a temperature gradient of only 1 K occurs over the total length. In addition and coinciding with the simulation in FIG. 2, the temperature for the cooling agent flowing through is clearly lower at the output of the cooling rail 9 than for an embodiment without flow stall centers. The temperature gradient along an arrangement without flow stall centers is approximately five times higher than for the solution according to the invention. It is particularly advantageous that the partitions 13 between the cooling ducts contribute considerably to the heat removal, since they are bonded material-to-material with the upper and lower cooling body surfaces.

Since cooling bodies for power gates normally are used under conditions at the upper limit of their capacity, the solution according to the invention increases the safety during the operation of such cooling bodies.

Figure 4A:
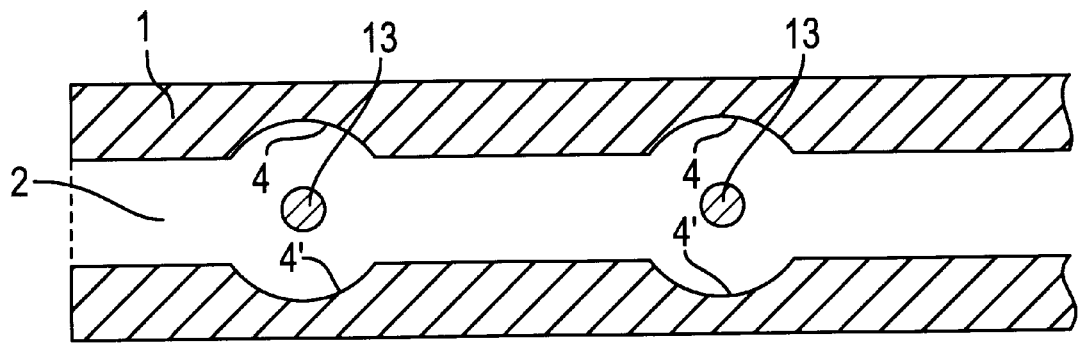
FIG. 4a is a section along a cooling duct with flow stall centers.
Figure 4B:
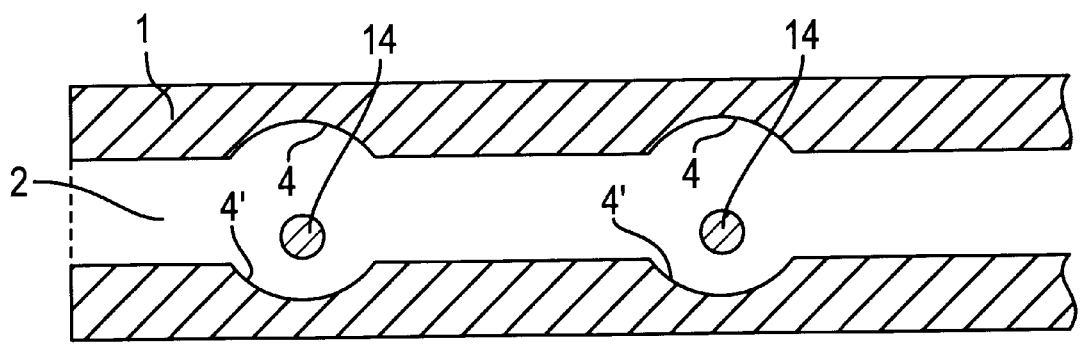
FIG. 4b is a section along a cooling duct with flow stall centers.

FIG. 4 shows additional arrangements of flow stall centers according to the invention, which have the effect of being nearly flow-resistance neutral as compared to an undisturbed cooling duct. The flow direction is in the image plane. In this case, the bodies 13, 14, in particular cylindrical bodies or bodies limited by square edges, are inserted lateral to the flow path into the cooling duct 2. These bodies can be arranged either in the duct center (FIG. 4a, body 13) or near the duct wall (FIG. 4b, body 14). The arrangement is essentially flow-resistance neutral within the meaning of the above statement if the bodies 13, 14 are arranged in the region of the enlargements and the cross sections of the bodies 13, 14 are smaller or approximately equal to the area increase for the cooling duct cross section through the enlargement.

A simple type of embodiment consists of inserting these bodies in the form of rods into the boreholes of the enlargements. In that case, the bodies 13, 14 are arranged essentially parallel to the upper and lower cooling surfaces in the exemplary embodiment shown in FIG. 3. It is useful to combine this embodiment in particular with the sealing of the boreholes in the partitions in the example in FIG. 3.

Figure 5:
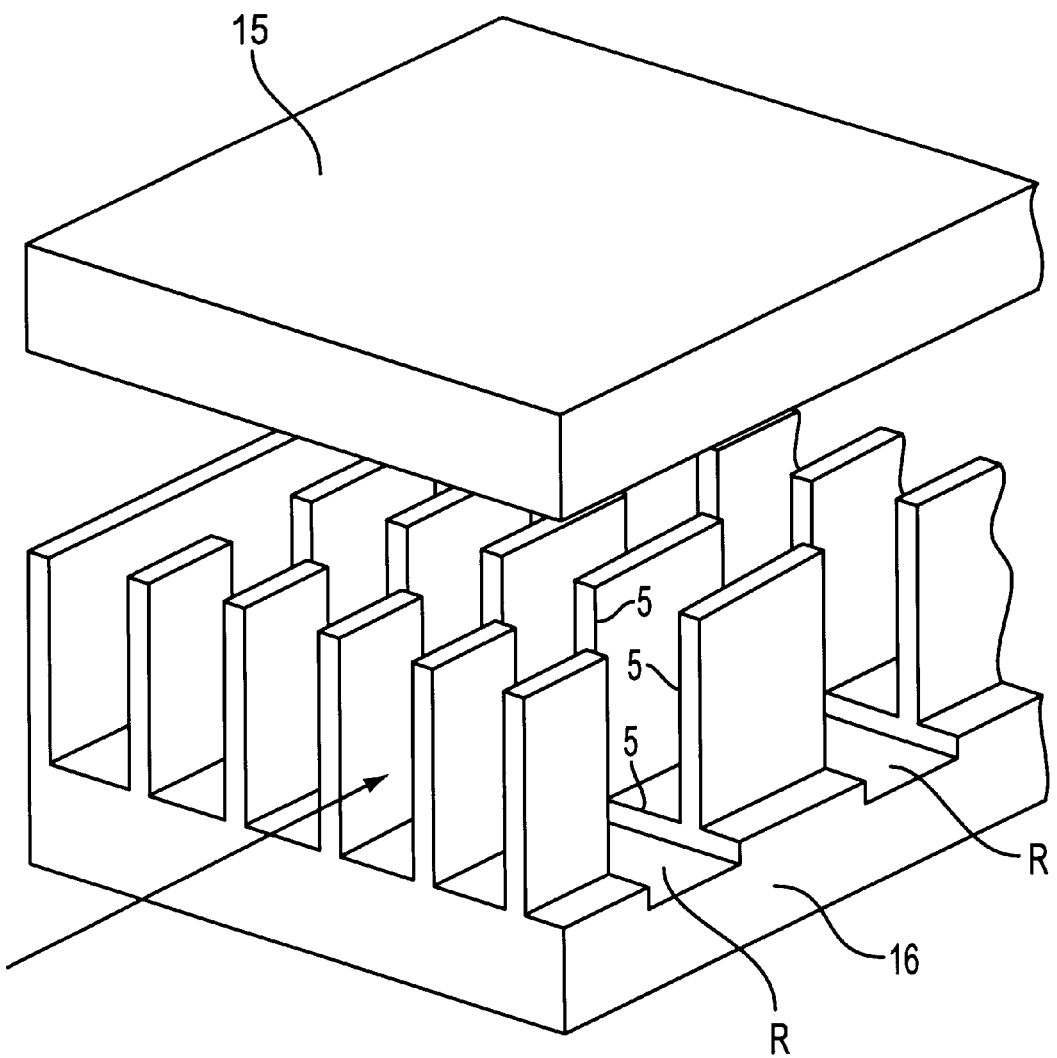
FIG. 5 is a section along a multipart cooling duct with flow stall centers according to the invention.

FIG. 5 shows an example of a multipart cooling body with flow stall centers in accordance with the invention. The cooling body is composed of an upper and a lower half. Both halves can accommodate components for cooling on the outside. The upper half 15 is designed as a simple plate. The lower half 16 has a number of preferably milled, parallel ducts or recesses R run through the inside facing the upper half 15. These ducts form the cooling ducts. The flow direction is indicated by an arrow. Material is removed continuously from the partitions and the ducts in crosswise direction of the ducts. The impact borders between the removal areas and the ducts form the flow stall centers in the cooling ducts. The lower half 16 is closed off with the upper half 15. In the Figure, the impact borders are therefore formed only on three of four possible cooling duct walls. The flow stall centers S on one of the cooling ducts are accentuated as representative of the conditions in the cooling ducts. It is also possible to design the two halves to be approximately symmetrical and to seal them suitably.

One embodiment with an upper and a lower half, in particular with a simple, unstructured half 15, makes it possible to insert bodies as additional flow stall centers into one or several cooling ducts in a simple way that is very favorable to the cooling. The bodies are connected with the inside of half 15 that is facing the cooling agent, in such a way that they project like fingers, lateral to the flow direction, into the cooling duct or ducts. The fingers can be connected in a suitable way to the half 15. It is preferable if the fingers are bonded material-to-material with the half. The design of the fingers can be round or square-edged. It is preferable if the fingers extend into the cooling duct or ducts at a place where enlargements are arranged according to the invention. However, it is also possible to arrange additional flow stall centers by using rod-shaped bodies lateral to the flow direction and parallel to the removal areas. These can be used for sealing the cooling ducts among each other, in a similar manner as for the embodiment in FIG. 3.

One advantage is the relatively simple production of the arrangement. Another advantage consists in that the inside surface of the cooling body on the whole is additionally increased and that the cooling is improved in the region of the enlargement.

The cooling bodies according to the invention are produced from a material that conducts heat well. Aluminum or an aluminum alloy are preferably used. If higher requirements must be met with respect to the electric insulating capability, a ceramic material is suitable, in particular aluminum nitride. The embodiment with a multipart cooling body is particularly suited for such a material, since the ceramic processing and the ceramic treatment are easier with it.

What is claimed is:

1. A cooling body having two sides with several cooling ducts extending parallel to each other and open on both sides for receiving a cooling agent that is supplied to the cooling ducts with a predetermined velocity and comprising an upper and a lower external cooling surface for accepting bodies to be cooled, wherein the cooling ducts are designed to have a nearly constant cross section lengthwise and comprising at least one flow stall center in the form of boreholes between the cooling ducts that extend lateral to a flow direction, and which in part forms an enlargement of the cooling duct cross section lateral to the flow direction, wherein the enlargement enlarges the cooling duct cross section in two dimensions of each cooling duct to form a total cross section, a circumferential curve of the total cross section of the cooling duct in the region of the enlargement, lateral to the flow direction, has measurements that are larger than the circumferential curve of the cooling duct outside of the enlargement.

2. A cooling body according to claim 1, wherein
   the total cross section of the cooling duct with a height and a depth lateral to the flow direction is expanded by at least twice a local flow boundary layer thickness if the flow is undisturbed.

3. A cooling body according to claim 1, further comprising impact edges at the transition between the enlargements and the cooling duct wherein the impact edges at the transition between the enlargements and the cooling duct are square-edged.

4. A cooling body according to claim 1, wherein
   the enlargements are designed to extend circumferentially around the duct cross section.

5. A cooling body according to claim 1, wherein each cooling duct has a plurality of enlargements respectively following each other and spaced apart in the flow direction, such that a heat-transfer coefficient α can drop to no more than one fourth of its respective value between any two adjacent enlargements.

6. A cooling body according to claim 1, wherein
the cooling duct has auxiliary boreholes lateral to the flow direction, for which the cross section parallel to the flow direction is greater than the dimensions of the cooling duct lateral to the flow direction.

7. A cooling body according to claim 1, wherein at least one of partitions and limiting walls of the cooling duct are at least on one side bonded material-to-material with the cooling body surfaces.

8. A cooling body according to claim 1, wherein
the cooling body is formed from one piece.

9. A cooling body according to claim 1, wherein
the cooling body is assembled at least indirectly of an upper and a lower section.

10. A cooling body according to claim 9, wherein
the upper and the lower section have recesses in flow direction.

11. A cooling body according to claim 9, wherein
the upper and/or the lower sections have recesses lateral to the flow direction.

12. A cooling body according to claim 9, wherein
the upper or the lower section has recesses in flow direction.

13. A cooling body according to claim 12, wherein
the section with recesses in flow direction has at regular intervals recesses lateral to the flow direction.

14. A cooling body according to claim 1, wherein
the cooling body has flow stall centers in the cooling duct, which are arranged parallel to the upper and lower cooling surface.

15. A cooling body according to claim 14, wherein
the cooling body has flow stall centers in the cooling duct, which are arranged perpendicular to the upper and lower cooling surface.

16. A cooling body according to claim 14, wherein
the flow stall centers are arranged in the region of the enlargement of the cooling duct.

17. A cooling body according to claim 16, wherein
the cross section of the flow stall centers lateral to the flow direction, is smaller than the area increase in the cooling duct cross section in the region of the enlargements.

18. A cooling body according to claim 1, wherein
the cooling body is molded from a ceramic material.

19. A cooling body according to claim 1, characterized in that
the cooling body (1, 9) is formed from a metallic material.

20. A cooling body according to claim 1, characterized in that
the cooling body (1, 9) is formed of aluminum or an aluminum alloy.

21. A cooling body having two sides with at least one cooling duct and being open for receiving a cooling agent that is supplied to the cooling duct with a predetermined velocity, comprising a first and a second external cooling surface for receiving bodies to be cooled, wherein the cooling duct is designed with a nearly constant cross section lengthwise and comprises at least one flow stall center, which partially expands the cross section of the cooling duct lateral to a flow direction, wherein between the first and second cooling surfaces, a plurality of parallel cooling ducts are formed that run essentially through one plane and have approximately identical dimensions, the plane being arranged parallel to the first and second cooling surfaces and tthe cooling ducts having auxiliary boreholes extending in the plane, which are spaced at regular intervals and lateral to the flow direction, and wherein the cross section for one of the auxiliary boreholes is larger than the cooling duct cross section.

22. A cooling body according to claim 21, wherein
the cooling body is formed from one piece.

23. A cooling body according to claim 21, wherein
the cooling body is at least indirectly assembled from an upper and a lower section.

24. A cooling body having two sides with at least one cooling duct and being open for receiving a cooling agent that is supplied to the cooling duct with a predetermined velocity, comprising a first and a second external cooling surface for receiving bodies to be cooled, wherein the cooling duct is designed with a nearly constant cross section lengthwise and comprises at least one flow stall center, which partially expands the cross section of the cooling duct lateral to a flow direction, wherein between the first and second cooling surfaces, a plurality of parallel cooling ducts are formed that run essentially through one plane and have approximately identical dimensions, the plane being arranged parallel to the first and second cooling surfaces and the cooling ducts having auxiliary boreholes extending in the plane, which are spaced at regular intervals and lateral to the flow direction, and wherein the cooling body has bodies or rods extending in boreholes in the cooling duct, the bodies or rods being arranged parallel to the first and second cooling surfaces.

25. A cooling body according to claim 24, wherein the bodies or rods are arranged in the region of enlargement of the cooling duct.

26. A cooling body according to claim 25, wherein the cross section of the bodies or rods lateral to the flow direction is smaller than the area increase of the cooling duct cross section in the region of the enlargement.

* * * * *